United States Patent
Lee

(10) Patent No.: US 7,825,020 B2
(45) Date of Patent: Nov. 2, 2010

(54) METHOD FOR MANUFACTURING SEMICONDUCTOR DEVICE

(75) Inventor: Seung Hyun Lee, Gwanak-gu (KR)

(73) Assignee: Hynix Semiconductor Inc., Icheon-si (KR)

( * ) Notice: Subject to any disclaimer, the term of this patent is extended or adjusted under 35 U.S.C. 154(b) by 219 days.

(21) Appl. No.: 12/147,157

(22) Filed: Jun. 26, 2008

(65) Prior Publication Data

US 2009/0246947 A1    Oct. 1, 2009

(30) Foreign Application Priority Data

Mar. 31, 2008    (KR) .................... 10-2008-0029771

(51) Int. Cl.
*H01L 21/28*    (2006.01)
*H01L 21/3205*    (2006.01)

(52) U.S. Cl. .................... 438/604; 438/603; 438/681; 257/E21.17; 257/E21.006; 257/E21.126; 257/E21.127; 257/E21.129; 257/E21.134; 257/E21.32

(58) Field of Classification Search ............. 438/331, 438/602, 603, 604, 680, 681, 712, 746, 752; 257/E21.006, 17, 126, 127, 129, 134, 32
See application file for complete search history.

(56) References Cited

U.S. PATENT DOCUMENTS

| | | | |
|---|---|---|---|
| 6,322,713 B1* | 11/2001 | Choi et al. | 216/38 |
| 6,340,822 B1* | 1/2002 | Brown et al. | 257/25 |
| 7,354,850 B2* | 4/2008 | Seifert et al. | 438/604 |
| 2004/0005258 A1* | 1/2004 | Fonash et al. | 422/271 |
| 2008/0142926 A1* | 6/2008 | Seifert et al. | 257/615 |

FOREIGN PATENT DOCUMENTS

| | | |
|---|---|---|
| KR | 10-2005-0062778 | 6/2005 |
| KR | 10-2006-0096886 | 9/2006 |
| KR | 10-2007-0038786 | 4/2007 |
| KR | 10-2008-0007682 | 1/2008 |

* cited by examiner

*Primary Examiner*—David Nhu
(74) *Attorney, Agent, or Firm*—Marshall, Gerstein & Borun LLP

(57) ABSTRACT

Disclosed herein is a method of manufacturing a semiconductor device that includes forming a metal catalytic pattern on a semiconductor substrate; etching the semiconductor substrate using the metal catalytic pattern as an etching mask to form a recess; forming an insulating layer over a structure including the recess, the metal catalytic pattern, and the semiconductor substrate; patterning the insulating layer to cross over the metal catalytic pattern and to expose a predetermined portion of the metal catalytic pattern; and growing a nano wire using the exposed predetermined portion of the metal catalytic pattern.

11 Claims, 3 Drawing Sheets

(i)

(ii)

(iii)

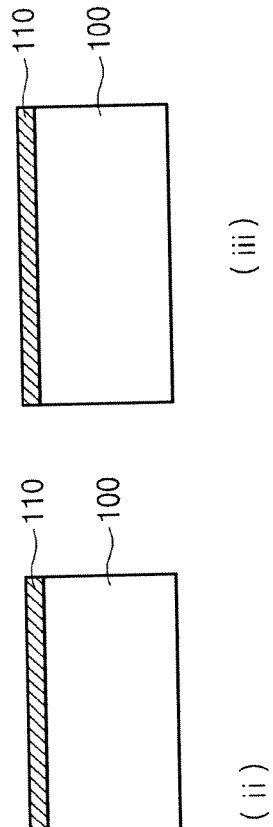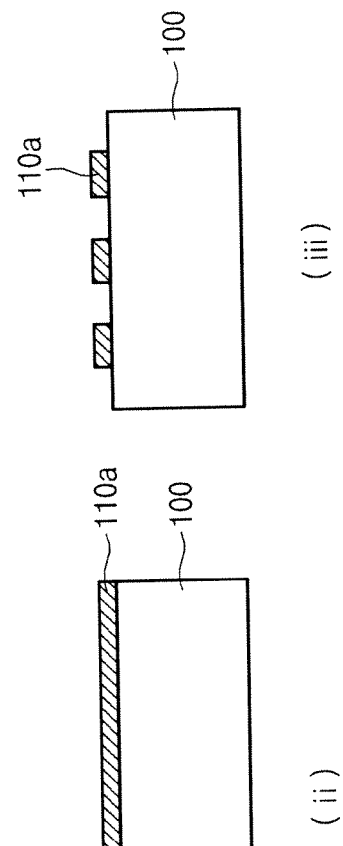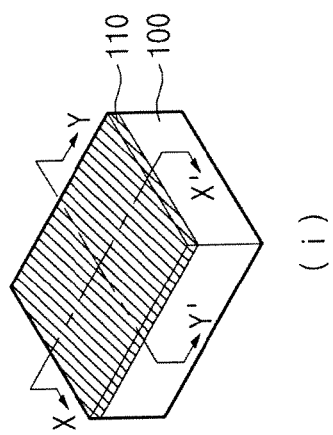
Fig.1a
Fig.1b

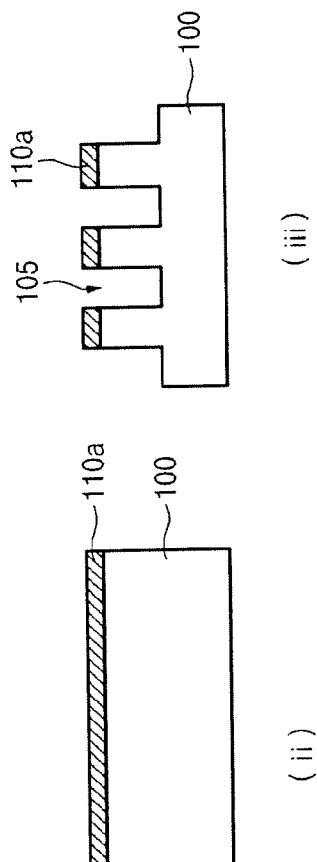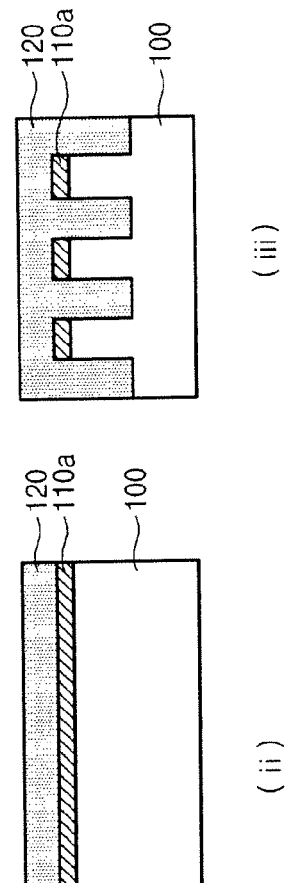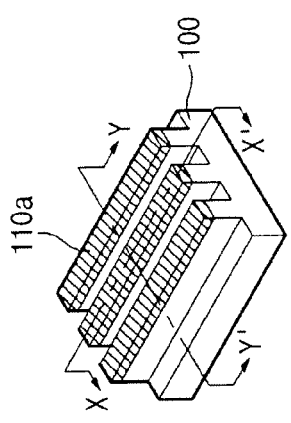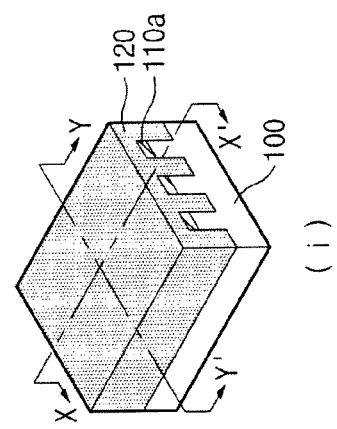
Fig.1c
Fig.1d

METHOD FOR MANUFACTURING SEMICONDUCTOR DEVICE

CROSS-REFERENCE TO RELATED APPLICATION

Priority to Korean patent application number 10-2008-0029771, filed on Mar. 31, 2008, the disclosure of which is incorporated herein by reference in its entirety, is claimed.

BACKGROUND OF THE INVENTION

The invention relates to a method of manufacturing a semiconductor device, and more particularly, to a method of manufacturing a semiconductor device having nano wires arranged at a regular distance.

A nano wire has a diameter on the order of a nanometer ($10^{-9}$ meters). Alternatively, nano wires have a lateral size constrained to tens of nanometers or less, and an unconstrained longitudinal size. At these scales, quantum mechanical effects are important, hence such wires are also known as "quantum wires." Typical nano wires exhibit aspect ratios (length-to-width ratio) of 1000 or more. As such they are often referred to as 1-dimensional materials. Recently, it has been suggested that nano wire technology can be applied to the manufacture a highly-integrated semiconductor device.

The above-described nano wires have many interesting electronic, chemical, physical, and optical properties that are not seen in bulk or traditional 3-D materials. This is because electrons in nano wires are quantum confined laterally, and thus occupy energy levels that are different from the traditional continuum of energy levels or bands found in bulk materials. These particular properties of the nano wires can be useful for increasing the integration of a semiconductor device.

Various methods for fabricating a nano wire, such as chemical polymerization, electrochemical polymerization, chemical vapor deposition (CVD), carbothermal reduction, and the like have been suggested. Chemical polymerization is generally used because chemical polymerization can be applied to the mass production of the semiconductor device. It is easy to transform a high molecular weight nano wire formed by chemical polymerization into not only a thin film dissolved by a solvent, but also a disc-shaped film vulcanized by a spin casting process. Furthermore, electronic properties of the high molecular weight nano wire can be adjusted by a dopant doping process.

Electrochemical polymerization is used for forming a thin film on a target layer. In an electrochemical polymerization process, a predetermined current is supplied to a plurality of monomers in an electrolyte to generate a radical and a high molecular weight material, such that the radical coats an exposed layer or a wafer as a thin film. Chemical polymerization and electrochemical polymerization have been continuously studied to determine which method is more effective for formation of a thin film.

CVD is a chemical process used to produce high-purity and high-performance solid materials. In a typical CVD process, the substrate is exposed to one or more volatile precursors, which react and/or decompose on the substrate surface to produce the desired deposit. CVD is often used in the semiconductor industry to produce thin films. Particularly, the fabrication process of the semiconductor device widely uses CVD to deposit materials in various micro forms, such as monocrystalline, polycrystalline, amorphous, and epitaxial forms.

Although nano wires can be formed on the same plane through the above-described methods, a metal catalytic layer is required when nano wires are to be formed vertically over a semiconductor substrate. For instance, in order to form vertically formed nano wires, the metal catalytic layer is first deposited on the semiconductor substrate, and then CVD is performed to deposit silicon in an epitaxial form. However, it is difficult to vertically arrange formed nano wires used as a fine pattern in the semiconductor substrate at a regular distance, and to reduce a resistance of the junction between each nano wire and a wire or a line coupled to the lower portion of each nano wire.

BRIEF SUMMARY OF THE INVENTION

Various embodiments of the invention are directed to providing a method of manufacturing a semiconductor device that comprises growing a nano wire using regularly arranged exposed portions of a metal catalytic pattern. The metal catalytic pattern is exposed between insulating pattern elements, which are intersected vertically. Since the insulating pattern and the metal catalytic layer are alternately arranged, an Ohmic contact is formed between the nano wire and a portion of the metal catalytic pattern positioned where the nano wire is not grown. Furthermore, the portion of the metal catalytic pattern positioned where the nano wire is not grown remains at a bottom portion on both sides of the nano wire to reduce resistance of a source line.

According to an embodiment of the invention, a method of manufacturing a semiconductor device includes: forming a metal catalytic pattern on a semiconductor substrate; etching the semiconductor substrate using the metal catalytic pattern as an etching mask to form a recess; forming an insulating layer over the resulting structure, including the recess, the metal catalytic pattern, and the semiconductor substrate; patterning the insulating layer to cross over the metal catalytic pattern and to expose a predetermined portion of the metal catalytic pattern; and growing a nano wire from the exposed predetermined portion of the metal catalytic pattern.

Preferably, the metal catalytic pattern includes a material selected from the group consisting of Ni, Co, Fe, Y, La, Cu, Au, Pt, and combinations thereof.

Preferably, the patterned insulating layer crosses the metal catalytic pattern at right angles. The insulating layer can be patterned, for example, by performing a lithography process to etch a partial portion of the insulating layer until the predetermined portion of the metal catalytic pattern is exposed.

The nano wire can be epitaxially grown, for example. The nano wire can be grown, for example, by a vapor-liquid-solid (VLS) process or a vapor-solid-solid (VSS) process.

The nano wire can include, for example, a group IV elemental semiconductor. The group IV elemental semiconductor can be, for example, silicon. The nano wire can include, for example, a group III-V compound semiconductor, including one element selected from the group consisting of Ga, In, Al, B, and combinations thereof, and one element selected from the group consisting of N, P, As, Sb, and combinations thereof.

The method can further include annealing the structure resulting after growth of the nano wire, including the nano wire and the insulating layer.

The nano wire can have, for example, a perpendicular style.

BRIEF DESCRIPTION OF THE DRAWINGS

FIGS. 1*a* to 1*f* are diagrams illustrating a method of manufacturing a semiconductor device according to an embodiment of the invention.

DESCRIPTION OF EMBODIMENTS

Figure 1E:
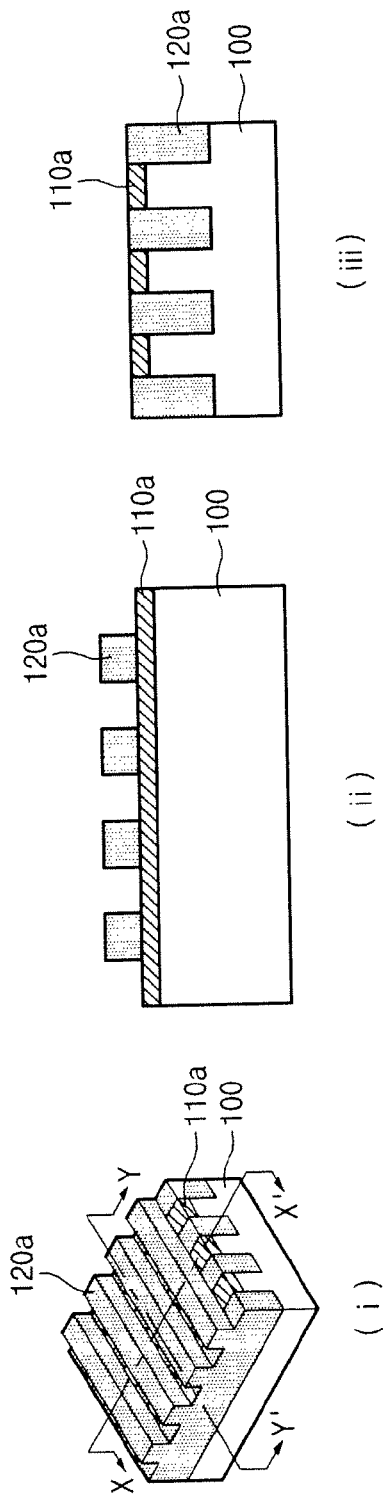

FIGS. 1a to 1f are diagrams illustrating a method of manufacturing a semiconductor device according to an embodiment of the invention. In each of FIGS. 1a to 1f, view (i) is a perspective view, view (ii) is a cross-sectional view taken along X-X' of view (i), and view (iii) is a cross-sectional view taken along Y-Y' of view (i).

Referring to FIGS. 1a and 1b, a metal catalytic layer 110 having a given thickness is deposited over a substrate 100. The substrate 100 is preferably silicon. The metal catalytic layer 110 preferably includes a material selected from the group consisting of Ni, Co, Fe, Y, La, Cu, Au, Pt, and combinations thereof.

The metal catalytic layer 110 is patterned to form a metal catalytic pattern 110a. The metal catalytic pattern 110a includes elements arranged in parallel with each other. The metal catalytic pattern 110a can be, for example, a line-type pattern.

The metal catalytic layer 110 can be patterned, for example, by a light exposing process, an E-beam exposing process, or a nano imprint exposing process.

Referring to FIG. 1c, the substrate 100 is etched using the metal catalytic pattern 110a as a mask to form a recess 105.

Referring to FIG. 1d, an insulating film 120 is formed over the resulting structure including the recess 105. The insulating film 120 fills the recess 105, and a top portion of the insulating film 120 is higher than a top portion of the metal catalytic pattern 110a such that the top portion of the metal catalytic pattern 110a is covered by the insulating film 120.

Referring to FIG. 1e, a photoresist pattern (not shown), having photoresist pattern elements disposed parallel to each other, is formed over the insulating film 120. The photoresist pattern elements are formed to cross over the metal catalytic pattern 110a elements, for example, at right angles.

The insulating film 120 is etched using the photoresist pattern (not shown) as a mask to form an insulating pattern 120a. The insulating pattern 120a includes top insulating pattern 120a elements, disposed above the metal catalytic pattern 110a (see FIG. 1e, view (ii)), and bottom insulating pattern 120a elements, disposed in the recess 105 (see FIG. 1e, view (iii)). The top and bottom insulating pattern 120a elements are formed to cross over each other. Preferably, the top insulating pattern 120a elements are formed perpendicular to the metal catalytic pattern 110a elements, and the bottom insulating pattern 120a elements are formed parallel to the metal catalytic pattern 110a elements. Accordingly, the top and bottom insulating pattern 120a elements are preferably formed perpendicular to one another.

In an etching process for forming the insulating pattern 120a, the metal catalytic pattern 110a serves as an etching barrier film. The metal catalytic pattern 110a is exposed by the etching process and the etching process is stopped such that the bottom insulating pattern 120a elements remain in the recess 105. Preferably, a top surface of the metal catalytic pattern 110a and a top surface of the bottom insulating pattern 120a are in the substantially the same plane.

Referring to FIG. 1e(ii), the insulating pattern 120a can be, for example, a line type pattern. A part of the metal catalytic pattern 110a is exposed between the top and bottom insulating pattern 120a elements.

Referring to FIG. 1e(i), the bottom insulating pattern 120a elements and the top insulating pattern 120a elements are preferably perpendicular to each other.

The exposed portions of metal catalytic pattern 110a are regularly arranged between the top and bottom insulating pattern 120a elements.

Figure 1F:
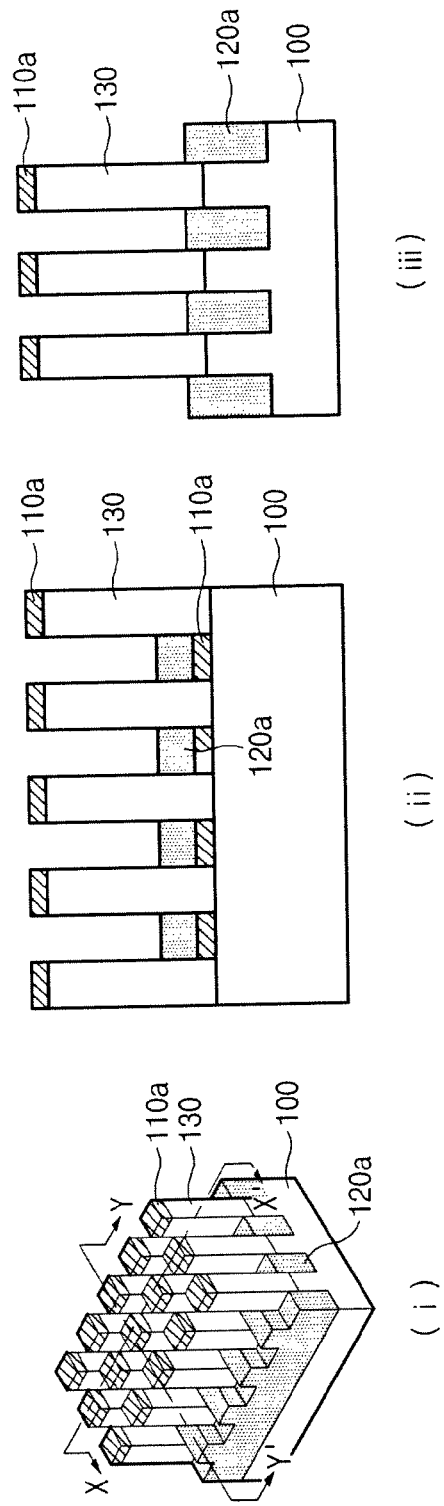

Referring to FIG. 1f, a nano wire 130 is grown using the portion of metal catalytic pattern 110a exposed by the insulating pattern 120a as a nano core.

The nano wire 130 can have, for example, a circular or oval cross section, and can be grown, for example, expitaxially.

The nano wire 130 can be grown, for example, by a Vapor-Liquid-Solid (VLS) process or Vapor-Solid-Solid (VSS) process, which can be performed in a reaction furnace.

The nano wire 130 can include a group III-V compound semiconductor, which is a compound semiconductor composed of elements from two or more different groups of the periodic table, or a group IV elemental semiconductor. Preferably, the nano wire 130 includes a GaP or a silicon.

The group III-V compound semiconductor can include, for example, one element selected from group 13, which consists of Ga, In, Al, B, and combinations thereof, and one element selected from group 15, which consists of N, P, As, Sb, and combinations thereof. Group III-V compound semiconductors include, for example, GaN and InP.

The group IV elemental semiconductor can be, for example, silicon.

When forming the nano wire 130 in a reaction path a gas atmosphere is used. The type of nano wire 130 formed is dependent upon the gas atmosphere in the reaction path. For example, when a gas including silicon is used, a silicon nano wire is grown. When a gas including Ga and N is used, a GaN nano wire is grown.

An annealing process can be additionally performed when the nano wire 130 is grown.

As mentioned above, the exposed portions of the metal catalytic pattern 110a are regularly arranged between intersecting insulating pattern 120a elements. The nano wire 130 can be vertically grown using the regularly arranged exposed portions of the metal catalytic pattern 110a.

The metal catalytic pattern 110a disposed in a portion where the nano wire 130 is not grown remains covered by the insulating pattern 120a, thereby reducing resistance of a source line.

In the above-described method of manufacturing a semiconductor device according to an embodiment of the invention, exposed portions of the metal catalytic pattern 110a are regularly arranged between insulating pattern 120a elements, so that a nano wire 130 can be vertically grown using the regularly arranged exposed portions of the metal catalytic pattern 110a to form a pattern of regularly arranged nano wires 130.

Since the insulating pattern 120a and the metal catalytic pattern 110a are alternately arranged, a portion of the metal catalytic pattern 110a disposed in a portion where the nano wire 130 is not grown remains covered by the insulating pattern 120a and forms an Ohmic contact between nano wires 130. Also, the covered portion of the metal catalytic pattern 110a remains at a bottom portion on both sides of the nano wire 130 to reduce the resistance of a source line.

The above-described embodiments of the invention are illustrative and not limitative. Various alternatives and equivalents are possible. The invention is not limited by the type of deposition, etching polishing, and patterning steps describe herein. Nor is the invention limited to any specific type of semiconductor device. For example, the invention may be implemented to form a dynamic random access memory (DRAM) device or non volatile memory device. Other additions, subtractions, or modifications are obvious in view of the disclosure and are intended to fall within the scope of the appended claims.

What is claimed:

1. A method of manufacturing a semiconductor device, comprising:
   (a) forming a metal catalytic pattern on a semiconductor substrate;
   (b) etching the semiconductor substrate using the metal catalytic pattern as an etching mask to form a recess;
   (c) forming an insulating layer over the resulting structure of (b), including the recess, the metal catalytic pattern, and the semiconductor substrate;
   (d) patterning the insulating layer to form insulating pattern elements that cross over the metal catalytic pattern and to expose a predetermined portion of the metal catalytic pattern; and
   (e) growing a nano wire using the exposed predetermined portion of the metal catalytic pattern.

2. The method according to claim 1, wherein the metal catalytic pattern comprises a material selected from the group consisting of Ni, Co, Fe, Y, La, Cu, Au, Pt, and combinations thereof.

3. The method according to claim 1, comprising patterning the insulating layer to form elements crossing the metal catalytic pattern at right angles.

4. The method according to claim 1, comprising patterning the insulating layer using a lithography process to etch a portion of the insulating layer until the predetermined portion of the metal catalytic pattern is exposed.

5. The method according to claim 1, comprising epitaxially growing the nano wire.

6. The method according to claim 1, comprising growing the nano wire using one of a vapor-liquid-solid processor a vapor-solid-solid process.

7. The method according to claim 1, further comprising annealing the resulting structure of (e), including the nano wire and the insulating layer.

8. The method according to claim 1, wherein the nano wire is perpendicularly grown.

9. The method according to claim 1, wherein the nano wire comprises a group IV elemental semiconductor.

10. The method according to claim 9, wherein the group IV elemental semiconductor is silicon.

11. The method according to claim 1, wherein the nano wire comprises a group III-V compound semiconductor comprising an element selected from the group consisting of Ga, In, Al, B, and combinations thereof, and an element selected from the group consisting of N, P, As, Sb, and combinations thereof.

* * * * *